US012593417B2

(12) United States Patent
Lee et al.

(10) Patent No.: US 12,593,417 B2
(45) Date of Patent:      Mar. 31, 2026

(54) ELECTRONIC DEVICE HAVING HOUSING HAVING MATT SURFACE AND METHOD OF PRODUCING THE SAME

(71) Applicant: Samsung Electronics Co., Ltd., Suwon-si (KR)

(72) Inventors: Yoonhee Lee, Suwon-si (KR); Juncheol Shin, Suwon-si (KR); Hangyu Hwang, Suwon-si (KR); Yucheol Kim, Suwon-si (KR); Jungmin Yeo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 540 days.

(21) Appl. No.: 17/811,402

(22) Filed: Jul. 8, 2022

(65) Prior Publication Data

US 2022/0400569 A1      Dec. 15, 2022

Related U.S. Application Data

(63) Continuation of application No. PCT/KR2022/008248, filed on Jun. 10, 2022.

(30) Foreign Application Priority Data

Jun. 10, 2021      (KR) ........................ 10-2021-0075580

(51) Int. Cl.
  *H05K 5/04*      (2006.01)
  *C25D 11/24*      (2006.01)
  *C25D 21/00*      (2006.01)
(52) U.S. Cl.
  CPC ...................................... *H05K 5/04* (2013.01)
(58) Field of Classification Search
  None
  See application file for complete search history.

(56) References Cited

U.S. PATENT DOCUMENTS

| | | | |
|---|---|---|---|
| 9,605,355 B2 | 3/2017 | Onomoto et al. | |
| 9,644,283 B2 | 5/2017 | Hankey et al. | |

(Continued)

FOREIGN PATENT DOCUMENTS

| | | | |
|---|---|---|---|
| CN | 101665968 A | | 3/2010 |
| CN | 105530789 A | * | 4/2016 |

(Continued)

OTHER PUBLICATIONS

De Hass et al., "Grain Boundary Segregation and Precipitation in Aluminum Alloys", 2001, Scripta Materialia, 44, pp. 281-286. (Year: 2001).*

(Continued)

*Primary Examiner* — Xiaobei Wang

(57)      ABSTRACT

Disclosed are an electronic device including a housing having a matte surface and a method of manufacturing the same. An electronic device according to various embodiments of the disclosure is an electronic device including a housing. The housing may include a base material including an aluminum alloy, a plurality of pits adjacently formed on a surface of the base material, and a crystal grain boundary protrusion part formed as a crystal grain boundary of the surface of the base material portion protrudes on the surface. A method of manufacturing a housing for an electronic device may include an etching step of generating irregularities on a surface of a base material including an aluminum alloy in a way to etch the base material by dipping the base material into an etching solution containing chloride ions, and an anodizing step of forming an anodizing layer on the surface of the base material by dipping, into an anodizing solution, the base material on which the etching step has been completed and applying a current to the base material by using the base material as an anode.

7 Claims, 12 Drawing Sheets

(56) References Cited

U.S. PATENT DOCUMENTS

| | | | |
|---|---|---|---|
| 2006/0231413 A1 | 10/2006 | Nishino et al. | |
| 2015/0001090 A1* | 1/2015 | Lai ....................... | C25D 11/243 |
| | | | 205/202 |
| 2015/0053566 A1 | 2/2015 | Kojima et al. | |
| 2019/0161882 A1 | 5/2019 | Peng et al. | |
| 2019/0338436 A1* | 11/2019 | Liao ....................... | H05K 5/069 |
| 2020/0241172 A1 | 7/2020 | Hayashi et al. | |
| 2020/0383224 A1 | 12/2020 | Curran et al. | |

FOREIGN PATENT DOCUMENTS

| | | | |
|---|---|---|---|
| CN | 111394769 A | 7/2020 | |
| JP | H10-183400 A | 7/1998 | |
| JP | 2001-059200 A | 3/2001 | |
| JP | 2002-069696 A | 3/2002 | |
| JP | 2005-042196 A | 2/2005 | |
| JP | 2005-042197 A | 2/2005 | |
| JP | 6322294 B2 | 5/2018 | |
| KR | 10-2012-0115998 A | 10/2012 | |
| KR | 10-2018-0079923 A | 7/2018 | |
| KR | 10-2020-0092723 A | 8/2020 | |

OTHER PUBLICATIONS

International Search Report and Written Opinion of the International Searching Authority dated Sep. 20, 2022, in connection with International Application No. PCT/KR2022/008248, 10 pages.
Office Action dated Feb. 6, 2026, in connection with Korean Application No. 10-2021-0075580, 16 pages.

* cited by examiner

S401 — WET OR DRY POLISHING

S402 — SPRAY BEADS ONTO SURFACE OF BASE MATERIAL

S403 — DIP INTO ETCHING SOLUTION

S404 — CHEMICAL POLISHING AND WASHING

S405 — DIP INTO ANODIZING SOLUTION AND APPLY CURRENT

S406 — SEALING PROCESSING

ELECTRONIC DEVICE HAVING HOUSING HAVING MATT SURFACE AND METHOD OF PRODUCING THE SAME

CROSS-REFERENCE TO RELATED APPLICATIONS

This application is a Bypass Continuation of International Application No. PCT/KR2022/008248, filed Jun. 10, 2022, which claims priority to Korean Patent Application No. 10-2021-0075580, filed Jun. 10, 2021, the disclosures of which are herein incorporated by reference in their entirety.

BACKGROUND

1. Field

Various embodiments disclosed in the disclosure relate to an electronic device including a housing having a matte surface and a method of manufacturing the same.

2. Description of Related Art

A housing of a portable electronic device may have metal, glass, plastic or a combination of them as its material. Among the materials, the metal material is widely used as a housing of a portable electronic device because the metal material has high intensity and shock toughness. Metal has a characteristic vulnerable to corrosion. Accordingly, in general, an oxide film may be formed on a surface of metal. Metal has the property of reflecting light, so that the texture of a surface of metal needs to be adjusted by surface processing.

Texture of a surface of a housing of a portable electronic device may be divided into glossy texture to matte texture depending on a degree of its luster. The texture and luster characteristic of the housing may be adjusted depending on prominences and depressions on a surface of the housing. In order to provide the irregularities to the surface of the housing, there is a method of roughening the surface of the housing through a physical method or roughening the surface by chemically etching the surface.

Fine irregularities on a surface of a housing generated through physical roughening are dissolved by a chemical reaction in chemical polishing and anodizing processes after the roughening, so that the luster of the surface may return to its original state. Accordingly, to obtain matte texture by fine irregularities is limited. Furthermore, if chemical roughening is performed, a corrosive chemical substance may damage an oxide film by penetrating into a gap of an anodized surface or may peel the oxide film from a metal base material by corroding the oxide film and the metal base material.

SUMMARY

Various embodiments disclosed in the disclosure may provide an electronic device including a housing having a surface, which has low luster and soft texture and includes an oxide film having improved durability.

Furthermore, various embodiments disclosed in the disclosure may provide method of manufacturing an electronic device including a housing having the aforementioned characteristics.

An electronic device according to various embodiments of the disclosure is an electronic device including a housing. The housing may include a base material including an aluminum alloy, a plurality of pits adjacently formed on a surface of the base material, and a crystal grain boundary protrusion part formed as a crystal grain boundary portion of the surface of the base material protrudes on the surface.

In an embodiment, the housing may include an anodizing layer formed on the surface of the base material, and a surface of the anodizing layer may have a prominence and depression shape corresponding to a irregularity shape formed by the pits and the crystal grain boundary protrusion part on the surface of the base material. In some embodiments, the anodizing layer may include pores aligned in a direction perpendicular to a geometric surface of the housing. In another embodiment, the anodizing layer may include a dye adsorbed within the pore. In still another embodiment, the anodizing layer may include a sealing area sealing one end of the pore. In some embodiments, the aluminum alloy of the base material may include aluminum of 80 wt % or more.

In an embodiment, the size of the pit may be 0.1 to 3 micrometers. In another embodiment, the height of the crystal grain boundary protrusion part may be 3 micrometers or less. In still another embodiment, the housing may have roughness of Ra 3 micrometers or less and gloss of 10 GU or less.

A method of manufacturing a housing for an electronic device according to another embodiment of the disclosure may include an etching step of generating irregularities on a surface of a base material including an aluminum alloy in a way to etch the base material by dipping the base material into an etching solution containing chloride ions, and an anodizing step of forming an anodizing layer on the surface of the base material by dipping, into an anodizing solution, the base material on which the etching step has been completed and applying a current to the base material by using the base material as an anode. In some embodiments, the etching step may include steps of forming, on the surface of the base material, pits neighboring each other as the chloride ions of the etching solution generate pitting corrosion with respect to the base material, and forming a crystal grain boundary protrusion part on the surface of the base material as the pitting corrosion more slowly corrodes a crystal grain boundary of the surface of the base material than an inside of a crystal grain.

In some embodiments, the etching solution may include hydrochloric acid or chloride salt. In another embodiment, the etching solution may include chloride ions of 10 wt % or less. In still another embodiment, the etching solution may further include phosphoric acid and organic acid. In still another embodiment, the etching solution may include phosphoric acid of 30 to 50 wt % and organic acid of 10 to 30 wt %.

In some embodiments, the etching step may be performed in a temperature range of 20 to 100° C. for 10 to 120 seconds.

In another embodiment, the anodizing step may include a step of forming a plurality of pores aligned in a direction perpendicular to the base material in the anodizing layer. The method of manufacturing a housing for an electronic device may further include a sealing step of sealing the pores of the anodizing layer by dipping the housing for the electronic device into a sealing solution, after the anodizing step.

In some embodiments, the anodizing solution may include a dye, and the anodizing step may include a step for the dye being adsorbed onto the pores formed in the anodizing layer. In another embodiment, the method may further include a polishing and washing step, including at least one of a step of chemically polishing cutting edges of the irregularities on the surface of the base material generated in the etching step or a desmutting step of removing a smut generated on the surface of the base material in the etching step, between the etching step and the anodizing step. In some embodiments, the method may further include a blasting step of roughening the surface of the base material by spraying ceramic, sand, diamond, metal or polymer beads onto the base material, prior to the etching step.

According to various embodiments disclosed in the disclosure, there can be provided the housing of an electronic device having an external appearance indicating low luster and soft surface texture because the pit and the crystal grain boundary protrusion part formed by etching are formed on a surface of the base material.

Furthermore, there can be provided the method of manufacturing a housing for an electronic device, which prevents and reduces damage to and the peeling of the anodizing layer attributable to an etching solution and improves the durability of the anodizing layer, because the anodizing layer is formed on a surface of the base material in the state in which the pit and the crystal grain boundary protrusion part have been formed by the etching step.

BRIEF DESCRIPTION OF THE DRAWINGS

In relation to the description of the drawings, the same or similar reference numerals may be used with respect to the same or similar constituent elements, in which in which.

DETAILED DESCRIPTION

Figure 1:
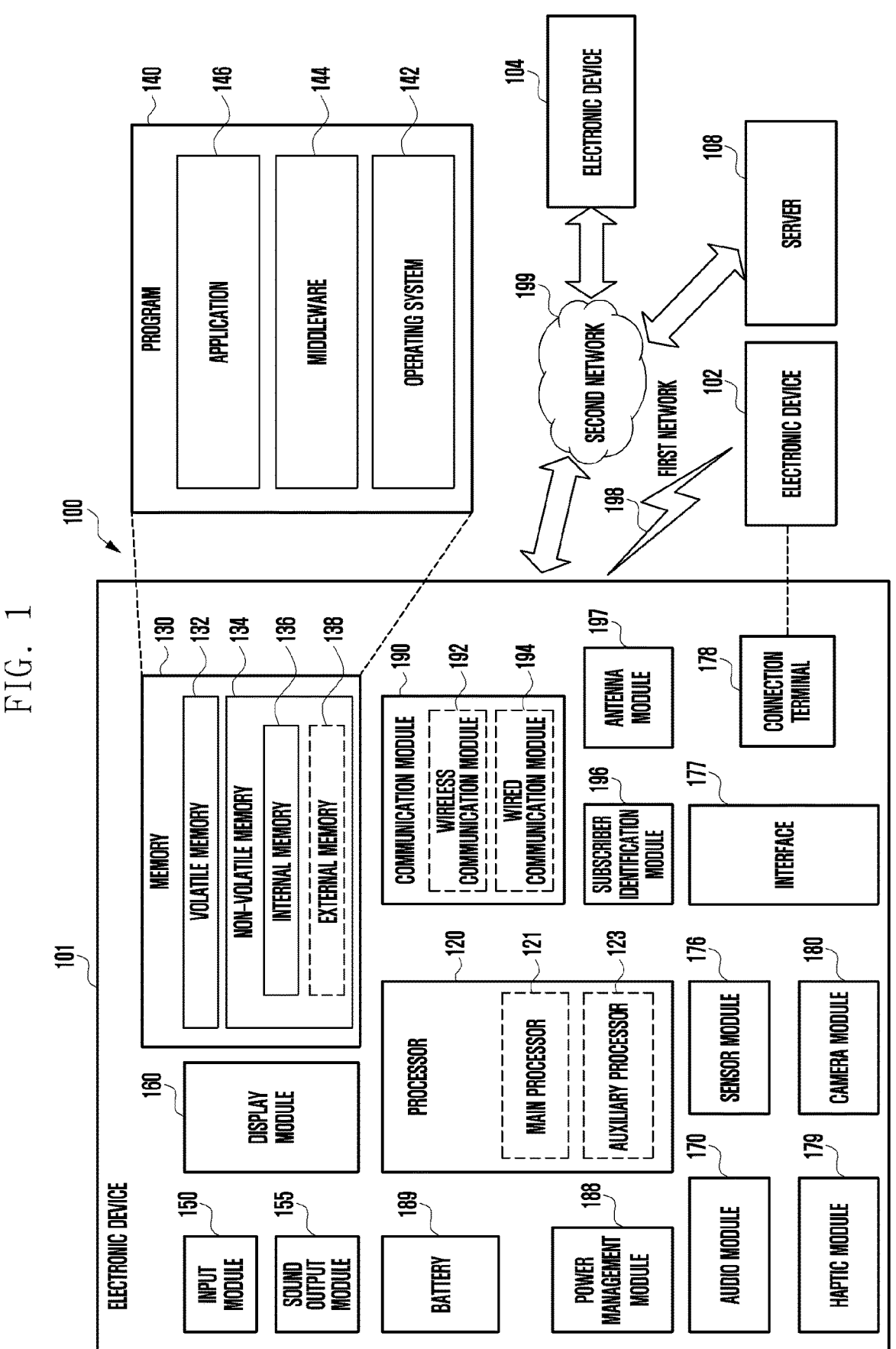
FIG. 1 is a block diagram illustrating an internal constitution of an electronic device according to an embodiment of the disclosure.

Hereinafter, preferred embodiments of the disclosure are described in detail with reference to the accompanying drawings. In these drawings, for example, the sizes and shapes of members may be exaggerated for convenience and clarity of description. Upon actual implementations, modifications of an illustrated shape may be expected. Accordingly, an embodiment of the disclosure should not be interpreted as being limited to a specific shape of an area illustrated in this specification.

Reference numerals of members in the drawings denote the same member throughout the drawings. Furthermore, as used in this specification, a term "and/or" includes any one of corresponding listed items and all combinations of one or more of the items.

Embodiments of the disclosure are provided to a person having ordinary knowledge in the art to more fully describe the present disclosure. The following embodiments may be modified in several other forms, and the scope of the disclosure is not limited by the following embodiments. Rather, these embodiments are provided to make the disclosure more faithful and complete and are provided to completely deliver the spirit of the disclosure to those skilled in the art.

A term used in this specification is used to described embodiments, and is not intended to limit the scope of the disclosure. Furthermore, although a term is described as the singular in this specification, the term may include a plurality of forms unless the singular is clearly indicated in the context. Furthermore, terms "comprise" and/or "comprising" used in this specification specify the presence of mentioned shapes, numbers, steps, operations, members, elements and/or a group of them, and do not exclude the presence or addition of another shape, number, operation, member, element and/or groups of them.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module(SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
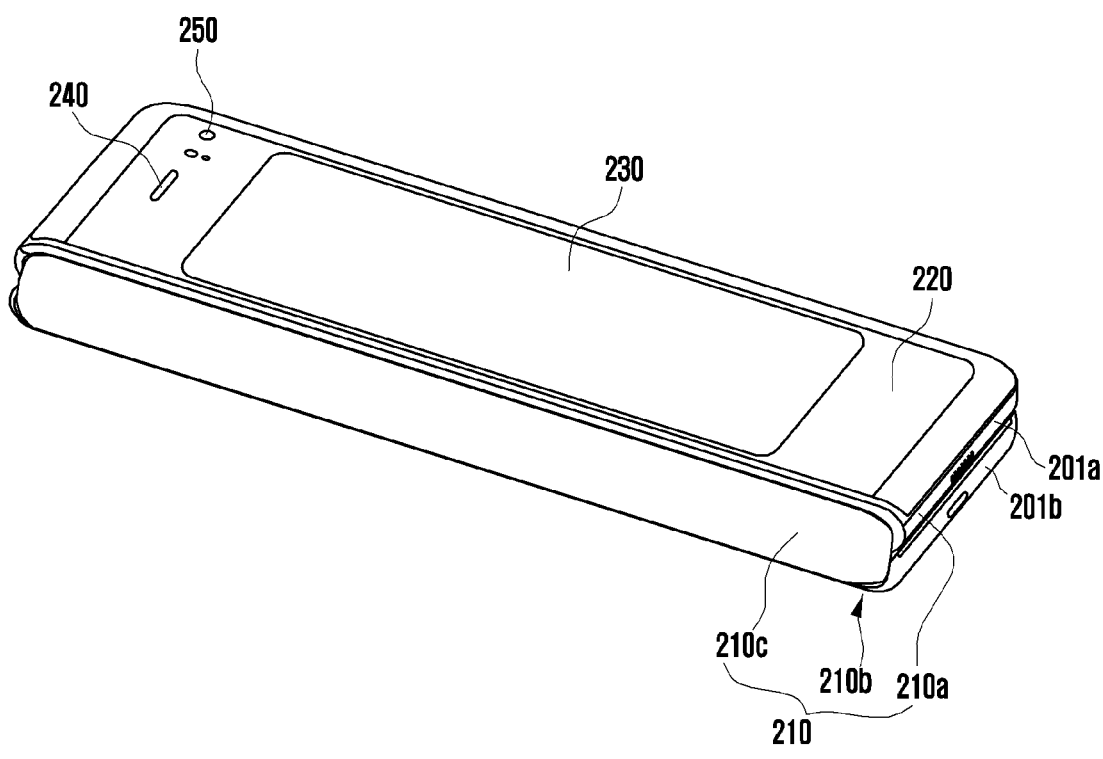
FIG. 2 is a perspective view illustrating an external appearance of the electronic device according to some embodiments of the disclosure.

FIG. 2 is a perspective view illustrating an external appearance of the electronic device 101 according to some embodiments of the disclosure.

With reference to FIG. 2, the external appearance of the electronic device may include a housing 210 and cover glass 220.

The cover glass 220 can protect a display panel 230 disposed on the front surface of the electronic device against an external factor, such as an impact, a scratch, a high temperature or ultraviolet rays. In some embodiments, the electronic device may include sensors 250 and a speaker 240 disposed on the front surface. The cover glass 220 may have an opening part through which at least one of the sensors 250 and the speaker 240 is exposed. In some embodiments, the cover glass 220 may be a glass or tempered glass material. In another embodiment, the cover glass 220 may be a transparent synthetic resin material, such as PMMA, polycarbonate or transparent polyimide.

The housing 210 is an external cover for protecting internal components of the electronic device, and may cover a part of the front surface of the electronic device and the side of the electronic device. In some embodiments, the electronic device may be a foldable electronic device configured to be capable of being folded and unfolded by a hinge (not illustrated). The foldable electronic device may include a first main body part 201*a* and a second main body part 201*b* that are rotatably coupled around the hinge. External surfaces of the first and second main body part 201*b* may be covered by a first housing 210*a* and a second housing 210*b*. In some embodiments, the housing 210 may include a hinge cover 210*c*. The hinge cover 210*c* can protect the hinge exposed to the outside when the electronic device is folded.

The housing 210 may include a metal material. The metal material has an advantage having excellent processability and durability. The housing 210 may include an anodizing layer for preventing and reducing the corrosion and abrasion of the metal material and assigning a color. The metal material may be preferably an aluminum alloy, for example.

The housing 210 may have a surface profile adjusted to adjust texture on an external appearance by the reflection and luster of the metal material. For example, the roughness and irregularity shape of a surface of the housing 210 may be adjusted in order to obtain matte texture. A detailed construction of the surface profile of the housing 210 and a method of forming the surface profile are described later.

Figure 3:
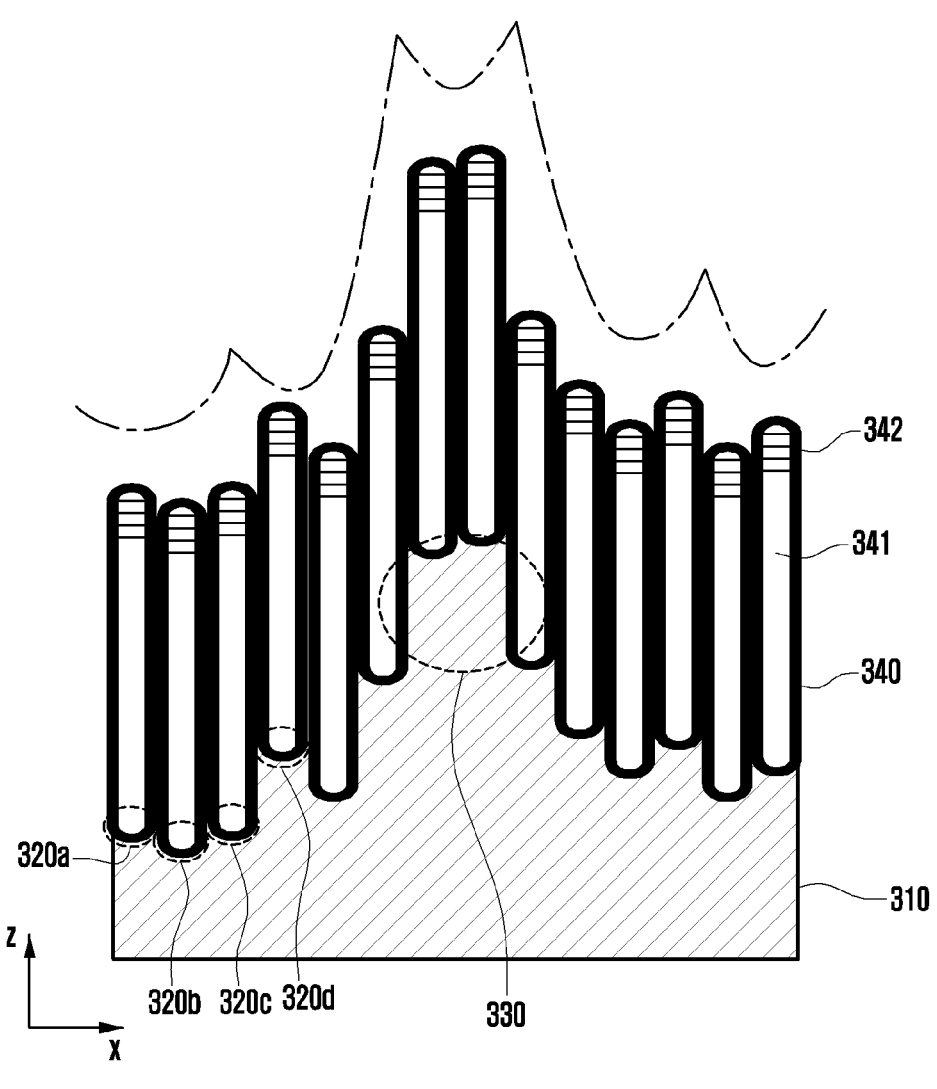
FIG. 3 is a diagram illustrating a surface of a housing of an electronic device according to an embodiment of the disclosure.

FIG. 3 is a diagram illustrating a surface of the housing 210 of the electronic device according to an embodiment of the disclosure.

In FIG. 3, an alternated long and short dash line is a line for indicating a irregularity shape of the surface of the housing.

With reference to FIG. 3, the housing 210 of an electronic device according to an embodiment of the disclosure may include a metal base material 310, the pit 320 (320*a*, 320*b*, 320*c*, and 320*d*), a crystal grain boundary protrusion part 330, and an anodizing layer 340.

The base material 310 may preferably include an aluminum alloy, for example. The aluminum alloy may include various alloying elements in order to improve physical properties. The alloying elements of aluminum may include at least one of copper, magnesium manganese, chromium, silicon, and zinc, for example. The aforementioned alloying elements may help to form a surface profile described later on a surface of the base material 310 upon chemical etching. In some embodiments, aluminum content of the aluminum alloy may be 80 wt % or more.

The pit 320 (320*a*, 320*b*, 320*c*, and 320*d*) may be a irregularity shape having a pit form formed on a surface of the base material 310. The diameter of the pit 320 (320*a*, 320*b*, 320*c*, and 320*d*) may be 0.1 to 3 μm. For example, the diameter of the pit may be about 1 μm. The pit 320 (320*a*, 320*b*, 320*c*, and 320*d*) may be formed in plural on the surface of the base material 310 in a way that the pits neighbor each other, and may assign a surface profile having given roughness to the surface of the base material 310.

The crystal grain boundary protrusion part 330 may be a portion more protruding than an average height of the surface of the base material 310 along a crystal grain boundary of the surface of the base material 310. The crystal grain boundary is a boundary surface between a plurality of crystal grains formed as the metal material of the base material 310 is grown with different alignments in a melting state. In the aluminum alloy, in general, the size of the crystal grain may be 10 to 100 μm. Since the crystal grains neighbor each other, the crystal grain boundary protrusion part 330 may have a irregularity shape protruding in the height direction of the surface of the base material 310 along a plurality of closed curves each having a diameter of 10 to 100 μm, which is formed in the surface of the base material 310. The protruding height of the crystal grain boundary protrusion part 330 may be 0.1 to 3 μm. The crystal grain boundary protrusion part 330 may generate additional irregularities with respect to the surface of the base material 310, thereby adjusting the roughness of the surface of the base material 310.

The roughness of a substance may be defined as a vertical direction deviation of an actual surface for a geometric surface of an object. The roughness may be quantized by calculating an arithmetic mean Ra of absolute values of a surface profile curve on the basis of an average line of a surface height within a reference length or calculating an arithmetic mean of the highest five peak heights and the deepest five indentation depths (ten-point mean roughness, Rz) from an average line of a surface height within a reference length. The housing 210 of the disclosure may have a matte surface having soft texture and low gloss because the housing has roughness of Ra 0.1 to 3 μm. If the roughness is excessively high, a bad user experience is provided in an external appearance and a touch because the texture of a surface roughens. To the contrary, if the roughness is excessively low, gloss appears because light generates regular reflection, and the housing 210 cannot show matte texture.

Gloss of a substance may appear as light incident from a light source to a surface of the substance is reflected while forming a given pattern. For example, regular reflection may appear as all pieces of light incident at a given angle are reflected in parallel substantially at the same angle as an incident angle if a surface of a substance is flat. A surface that generates such regular reflection may show high gloss. In contrast, diffused reflection may appear as light incident at a given angle is irregularly reflected in a plurality of directions by prominences and depressions, if a surface of a substance has given roughness including a plurality of irregularities. A surface that generates such diffused reflection may show matte surface texture having low gloss.

Under standards, such as ASTM D523, ISO 2813, and ISO 5190, specular gloss may be measured by comparing the amount of light incident at a given incident angle (e.g., 60 degrees) from a standardized light source with the amount of light reflected at the same reflection angle as an incident angle. Such a gloss value may be indicated as a glass unit (GU), that is, a dimensionless number that indicates a measured value compared to a measured value of a standard sample. The standard sample may be black glass, barium crown glass or quartz that has a refractive index of 1.567, for example, and is polished with roughness of about 0.1 nm so that the standard sample can generate regular reflection. Specular gloss of the standard sample is defined as 100 GU. The housing 210 of the disclosure has a roughness value of Ra 0.1 to 3 μm due to the pit 320 (320*a*, 320*b*, 320*c*, and 320*d*) and the crystal grain boundary protrusion part 330 formed on the surface of the base material 310, and thus may have a gloss degree of 10 GU or less upon measurement at an incident angle of 60 degrees.

The anodizing layer 340 may be an oxide layer generated on the surface of the base material 310 by anodizing. For example, if the metal base material 310 is an aluminum alloy, the anodizing layer 340 may include crystal or amorphous aluminum oxide (Al2O3). The anodizing layer 340 can protect the base material 310 against the corrosion and abrasion of the base material 310.

The thickness of the anodizing layer 340 may be substantially constant in the entire surface of the housing 210. If the thickness of the anodizing layer 340 is constant, a surface of the anodizing layer 340 may have a irregularity shape (indicated as the alternated long and short dash line in FIG. 3) corresponding to a prominences and depression shape of the surface of the base material 310. Accordingly, the surface of the anodizing layer 340 may have substantially the same roughness and gloss characteristic as the surface of the base material 310.

In some embodiments, the anodizing layer 340 may include pores 341 formed in a direction perpendicular to a geometric surface of the base material 310 of the housing 210. The pores 341 may be arranged and formed to neighbor each other, in a direction perpendicular to a geometric surface (e.g., a z axis direction in FIG. 3) of the housing 210 regardless of a shape surface of the irregularities on the surface of the base material 310. The term "geometric surface" of the housing 210 may mean a geometrically idealized surface except fine prominences and depressions on the surface of the base material 310 or a surface having an average height of the heights of fine prominences and depressions on the surface of the base material. In some embodiments, the top of the pore 341, that is, an end in the surface direction of the anodizing layer 340, may be opened. In another embodiment, the top of the pore 341 may be subjected to sealing processing by a sealing area 342. As the pore 341 of the anodizing layer 340 is sealed by the sealing area 342, damage to the anodizing layer 340 attributable to the penetration of a corrosive component through the pore 341 of the anodizing layer 340 can be prevented and reduced, and corrosion resistance of the housing 210 can be improved. In some embodiments, the sealing area 342 may include boehmite (AlO(OH)), that is, a hydrate.

The pore 341 may additionally diffuse light incident on the housing 210 by internal total reflection. Furthermore, in some embodiments, a dye (not illustrated) is adsorbed within the pore 341. The dye may assign hue to the housing 210 by selectively reflecting light having a specific wavelength among pieces of incident light.

Figure 4:
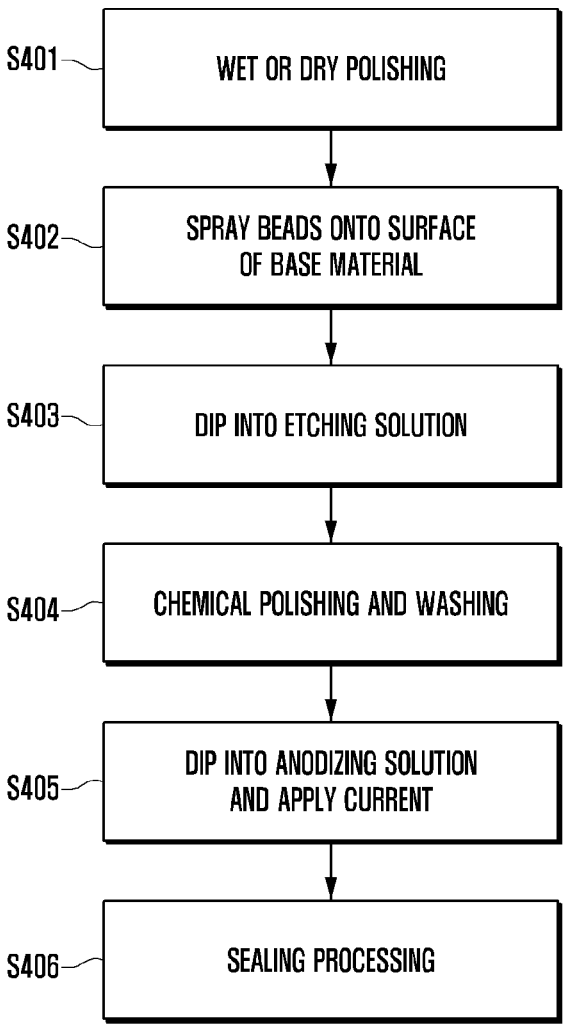
FIG. 4 is a flowchart illustrating a method of manufacturing the housing of an electronic device according to some embodiments of the disclosure.

FIG. 4 is a flowchart illustrating a method of manufacturing the housing 210 of an electronic device according to some embodiments of the disclosure.

Figure 5:
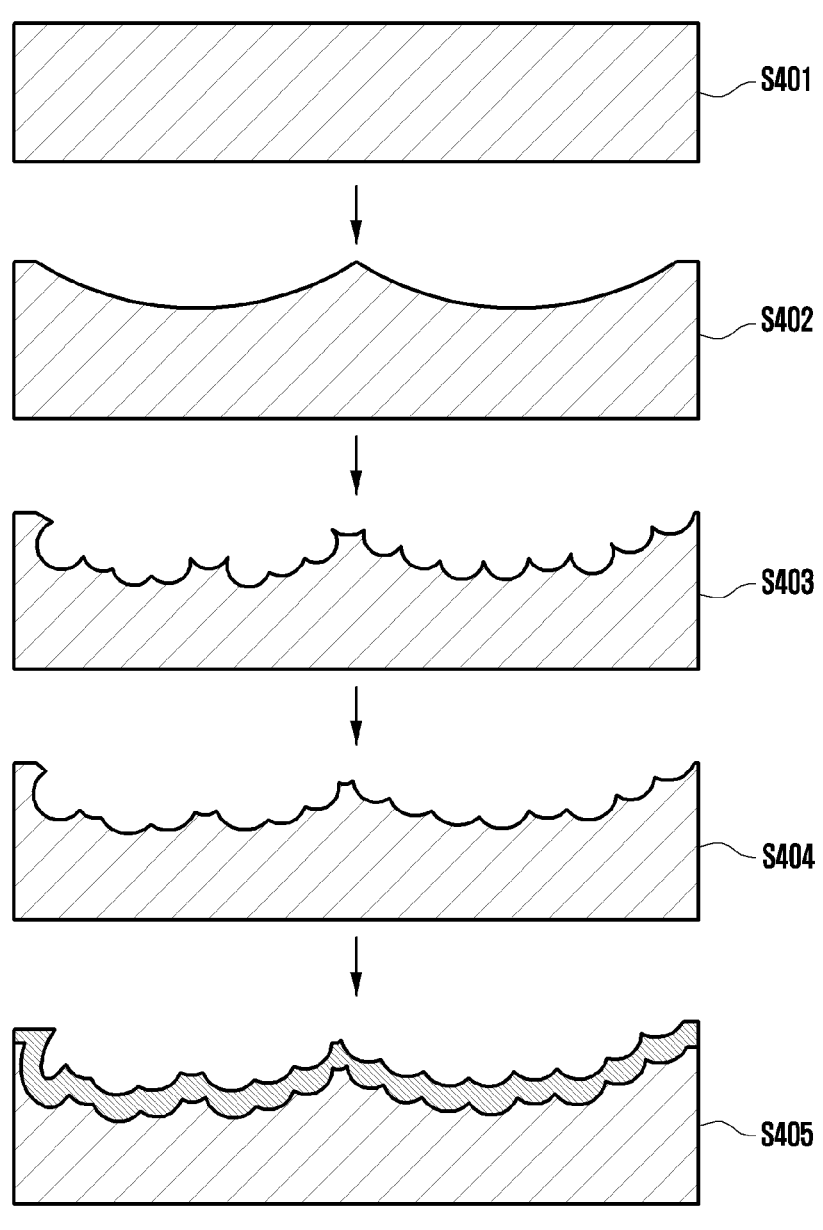
FIG. 5 is a diagram illustrating a process of manufacturing the housing according to some embodiments of the disclosure.

FIG. 5 is a diagram illustrating a process of manufacturing the housing 210 according to some embodiments of the disclosure.

With reference to FIGS. 3 and 4, the method of manufacturing the housing 210 of an electronic device may include an etching step S403, a polishing and washing step S404, an anodizing step S405, and a post-processing step.

The etching step S403 may be a step of forming the pit 320 (320a, 320b, 320c, and 320d) and the crystal grain boundary protrusion part 330 on a surface of the base material 310 by corroding the metal base material 310 by dipping the metal base material 310 into an etching solution. The etching solution may include chloride ions (Cl–). In some embodiments, the etching solution may include hydrochloric acid (HCl) and/or chloride salt (e.g., sodium chloride) in order to provide chloride ions.

The chloride ions may generate pitting corrosion that generates the pit 320 (320a, 320b, 320c, and 320d) having a size of 0.1 to 3 μm by corroding metal of the base material

310 through an oxidation reaction. For example, if the base material 310 is an aluminum alloy, a reaction, such as Chemical Formula 1 below, may occur.

$$2Al+6Cl- \rightarrow 2AlCl3+6e- \qquad \text{[Chemical Formula 1]}$$

The pitting corrosion of aluminum by the chloride ions may start by exposing the aluminum base material 310 as the chloride ions penetrate into a natural oxide film to a certain degree and locally corrode a given point of the natural oxide film. The aluminum alloy includes precipitates composed of the aluminum base material 310 and alloying elements. The precipitates may act as a cathode including a galvanic pair, and the aluminum may act as an anode, so that galvanic corrosion occurs and the pit 320 (320a, 320b, 320c, and 320d) is generated and expanded.

The galvanic corrosion may greatly occur as a potential difference between the cathode and the anode is greater. Elements such as zinc, copper, silicon, and manganese, that is, major alloying elements of the aluminum alloy, have a higher standard reduction potential than aluminum. Accordingly, as smaller alloying elements are contained within an aluminum crystal lattice, the galvanic corrosion may greatly occur. In some embodiments, in order to show the pitting corrosion phenomenon of the aluminum alloy by the chloride ions, aluminum content of the base material may be 80 wt % or more.

In some embodiments, the galvanic corrosion of the base material 310 may more rapidly occur within a crystal grain boundary than at a crystal grain boundary. Accordingly, the base material 310 may have a surface profile in which the crystal grain boundary protrudes and the inside of the crystal grain boundary sinks.

In an alloy including a plurality of elements, the addition of an alloying element may lower a melting point of the alloy. In a multi-component phase diagram of such an alloy, a solidus line of a solid phase may be present at a low temperature as a concentration of the alloying elements increases. Accordingly, in a process of such an alloy coagulating from a melting state thereof, metal crystals growing within a liquid phase may have a low concentration of alloying elements in the early stages of nucleation, but may have a higher concentration of the alloying elements while experiencing a growth process.

Furthermore, in an alloy including a plurality of elements, an alloying element solubility of a liquid phase may be higher than an alloying element solid solubility of a solid phase. In a process of such an alloy coagulating from a melting state thereof, an alloying element may be concentrated in a liquid phase. Accordingly, as the growth of metal crystal proceeds, a concentration of the remaining alloying element in the liquid phase may become high.

Due to the aforementioned thermodynamic driving force, crystal grains of an alloy that has coagulated may have a low concentration of alloying elements in a central part thereof and may have a high concentration of the alloying elements in a portion close to a crystal grain boundary. Such a phenomenon may be called crystal grain boundary segregation or coring. Due to the aforementioned coring, the inside of a crystal grain containing less alloying elements may more rapidly corrode than at a crystal grain boundary. Accordingly, the crystal grain boundary protrusion part 330 may be formed on a surface of the base material 310. The coring phenomenon described in the aluminum alloy may occur when aluminum content is 80 wt % or more.

In some embodiments, the etching solution may contain chloride ions of 10 wt % or less. When a concentration of the chloride ions is greater than 10%, the pits 320 (320a, 320b, 320c, and 320d) may be interconnected due to an excessively high corrosion speed of the pits 320 (320a, 320b, 320c, and 320d), so that prominences and depressions on a surface of the base material 310 may be chemically abraded to show a smooth surface. Accordingly, gloss that deteriorates the matte texture of the housing 210 may occur. The etching step S403 may be performed by dipping the base material 310 into the etching solution in a temperature range of 20 to 100° C. for 10 seconds to 120 seconds. When the temperature is lower than 20° C. or the reaction time is less than 10 seconds, sufficient pitting corrosion does not occur. When the temperature is higher than 100° C. or the reaction time is greater than 120 seconds, a surface of the base material 310 may be smoothed by excessive etching.

In some embodiments, the etching solution may include phosphoric acid and organic acid. The phosphoric acid may remove a natural oxide film formed as an aluminum surface comes into contact with oxygen in the atmosphere. The organic acid may be used as a buffer for maintaining acidity (pH) in an etching process. Furthermore, the organic acid can improve the wetting of the aluminum surface for the etching solution by lowering interfacial energy between aluminum and the etching solution. The etching solution may include phosphoric acid of 30 to 50 wt % and organic acid of 10 to 30 wt %.

In some embodiments, the organic acid may further include oxalic acid, acetic acid, citric acid, gallic acid, sulfonic acid, or acid including a carboxyl and/or sulfo group similar thereto. In still another embodiment, the etching solution may include gallic acid. If organic garlic acid is mixed with chlorine salified ions and used to etch aluminum, the garlic acid can lower a current density that generates galvanic corrosion by being adsorbed onto the aluminum surface, so that the speed at which etching is performed can be finely adjusted.

The polishing and washing step S404 may be a step of washing an alien substance on the surface formed in the etching step S403 and polishing the irregularities on the surface of the base material 310.

In some embodiments, the polishing and washing step S404 may include a step of smoothing the texture in a way to remove a pointed portion on the surface of the base material 310 generated due to the pitting corrosion by dipping, into a chemical polishing solution, the base material 310 on which the etching step S403 has been completed. In some embodiments, the chemical polishing solution may be at least one mixed solution of phosphoric acid, sulfuric acid or nitric acid. A degree of chemical polishing may be adjusted based on target surface texture and a degree of gloss. In some embodiments, the chemical polishing may be performed at room temperature or a temperature of 100° C. or less for 10 to 120 seconds.

In some embodiments, the polishing and washing step S404 may include a step of desmutting the surface of the base material 310. In the etching process, various reaction products including hydrogen having a gas phase, an intermetallic compound, and a hydrate of metal may be attached to a surface of an aluminum alloy. The reaction product of the aluminum surface is called a smut. Desmutting may be performed by dipping, into a desmutting solution, the base material 310 on which etching has been completed. In some embodiments, the desmutting solution may include nitric acid (HNO3), sulfuric acid (H2SO4), a chromate, phosphoric acid, and fluoride. Solutions used in the chemical polishing and the desmutting may be common. In some embodiments, the desmutting and the chemical polishing may be simultaneously performed.

The anodizing step S405 may be a step of forming (anodizing) the anodizing layer 340 on the surface of the base material 310 by flowing a current into the base material 310 in the state in which the base material 310 has been dipped into the anodizing solution by using, as an anode, the base material 310 on which the polishing and washing step S404 has been completed. According to the method of manufacturing the external cover 210 according to the disclosure, the anodizing step S405 is performed after the etching step S403. Accordingly, damage and a peeling phenomenon which may occur in the anodizing layer 340 when the etching solution is added in order to roughen a surface of the anodizing layer 340 can be prevented and reduced, so that the durability of the anodizing layer 340 can be improved.

The anodizing layer 340 generated by the anodizing may have substantially the same thickness despite the irregularities on the surface of the base material 310. Accordingly, the surface of the anodizing layer 340 may have a irregularity shape corresponding to a prominences and depression shape of the surface of the base material 310. An external appearance of the final product on which the anodizing processing has been completed may also have substantially the same roughness of Ra 0.1 to 3 μm as the surface of the base material 310, so that the external appearance may have low glossy texture, matte texture, and soft texture.

In some embodiments, the anodizing solution may be an acid solution, such as sulfuric acid, oxalic acid, chromic acid or a mixture thereof. In another embodiment, the anodizing solution may be an alkaline solution, such as sodium hydroxide, sodium phosphate, or ammonia fluoride. In still another embodiment, the anodizing solution may be a non-aqueous solution, such as formamide boric acid.

In the anodizing step S405, the pore 341 may be formed in the anodizing layer 340. In the case of an aluminum alloy, the pore 341 may grow in a direction perpendicular to a surface direction of the base material 310 due to a field assisted dissolution (FAD) phenomenon in which the dissolution of aluminum oxide is accelerated, because aluminum oxide is locally dissolved by the anodizing solution and an electric field is concentrated on a dissolved point.

The anodizing may be performed by electrification for 10 minutes to 120 minutes in a condition including 5 to 25° C. and a voltage of 5 to 25 V, but this is illustrative. In order to achieve an object of the disclosure, reference may be made to various known technologies about the anodizing of a metal material.

In some embodiments, the anodizing solution may include a dye. The anodizing step S405 may include a step of adsorbing a dye to the pore 341 formed in the anodizing layer 340.

In some embodiments, after the anodizing step S405, the sealing step S406 of sealing the pore 341 of the anodizing layer 340 may be performed. In some embodiments, the sealing step S406 may be performed as oxide is changed into a hydrate by applying, to the anodizing layer 340, deionized (DI) water or vapor having a high temperature and the pore 341 is closed by the expansion of volume upon change into the hydrate. In another embodiment, the sealing step S406 may include a known sealing process, such as dichromate sealing, sodium silicate sealing, acetate sealing, potassium permanganate sealing or polymer sealing, but this is illustrative. A sealing method may be selected depending on the use of the housing 210 and required durability.

In some embodiments, prior to the etching step S403 a blasting step S402S403 may be performed. The blasting step S402S403 may be a step of physically generating irregularities on a surface of the base material 310 by spraying beads onto the surface of the base material 310. The bead may include a high hardness material, such as ceramic, sand, diamond, stainless metal (e.g., stainless steel), glass, or hard polymer. The irregularities generated by the blasting step S402S403 may have higher roughness than prominences and depressions generated by etching. By combining the irregularities by the blasting and the prominences and depressions by the etching, more rough texture may be implemented compared to a case where the prominences and depressions are generated by only the etching.

In some embodiments, prior to the etching step S403, a polishing step S401 may be performed. The polishing step S401 performed prior to the etching step S403 may be a process of physically and/or chemically lapping a surface of the base material 310 through dry and/or wet polishing means. In the polishing step S401, roughness having a desired level may be obtained by removing irregularities previously present on a surface of the base material 310, before prominences and depressions are formed on the surface of the base material 310. Furthermore, the polishing step S401 may be a process of removing a defect, such as a burr formed in a process of processing the base material 310 by milling and/or a press in order to fabricate a basic shape of the housing 210.

Figure 6A:
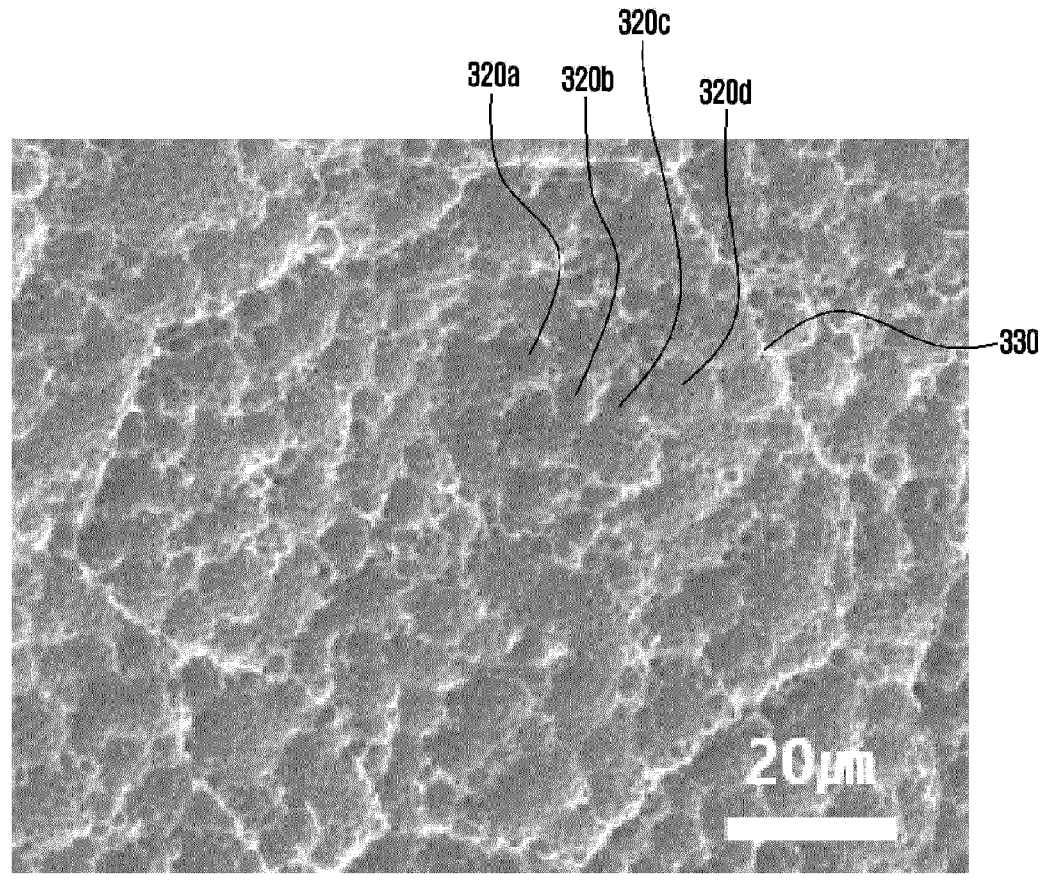
FIG. 6A is a photo obtained by photographing a surface of the housing on which an etching step according to an embodiment of the disclosure has been completed by using an electron microscope.

FIG. 6A is a photo obtained by photographing a surface of the housing 210 on which the etching step S403 according to an embodiment of the disclosure has been completed by using an electron microscope.

Figure 6B:
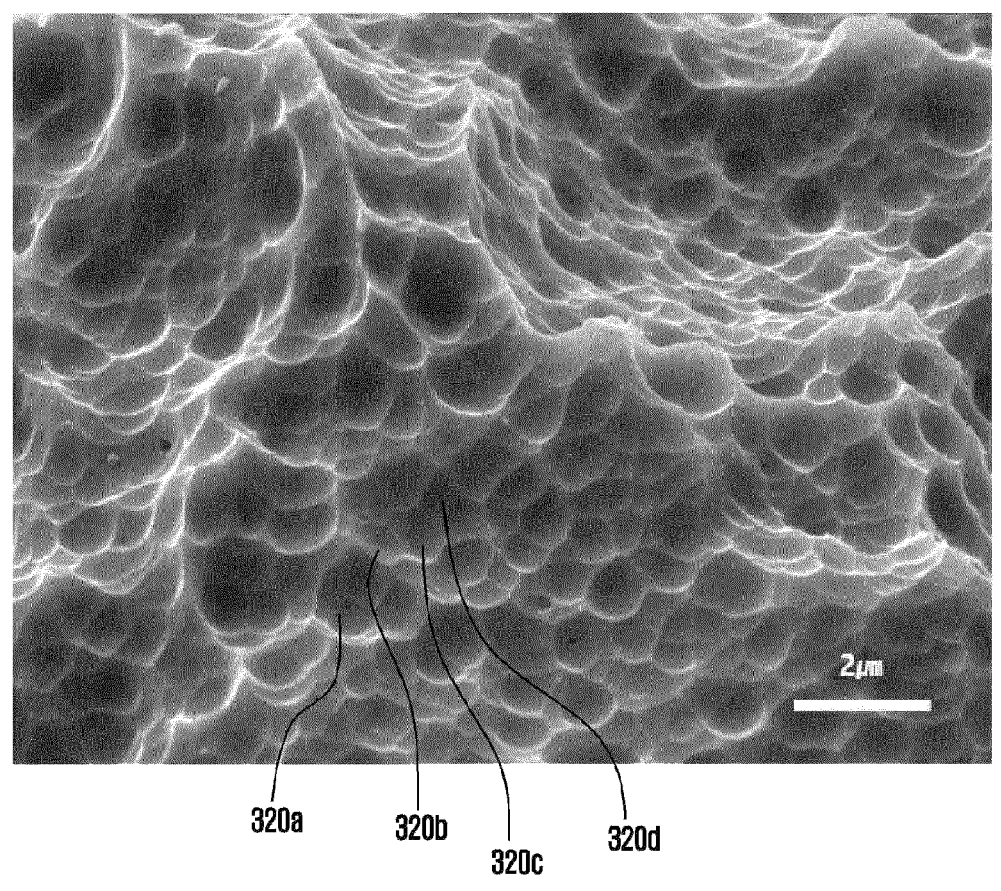
FIG. 6B is a photo obtained by enlarging and photographing a pit formed on a surface of the housing on which the etching step according to an embodiment of the disclosure has been completed.

FIG. 6B is a photo obtained by enlarging and photographing the pit 320 (320a, 320b, 320c, and 320d) formed on a surface of the housing 210 on which the etching step S403 according to an embodiment of the disclosure has been completed.

Figure 6C:
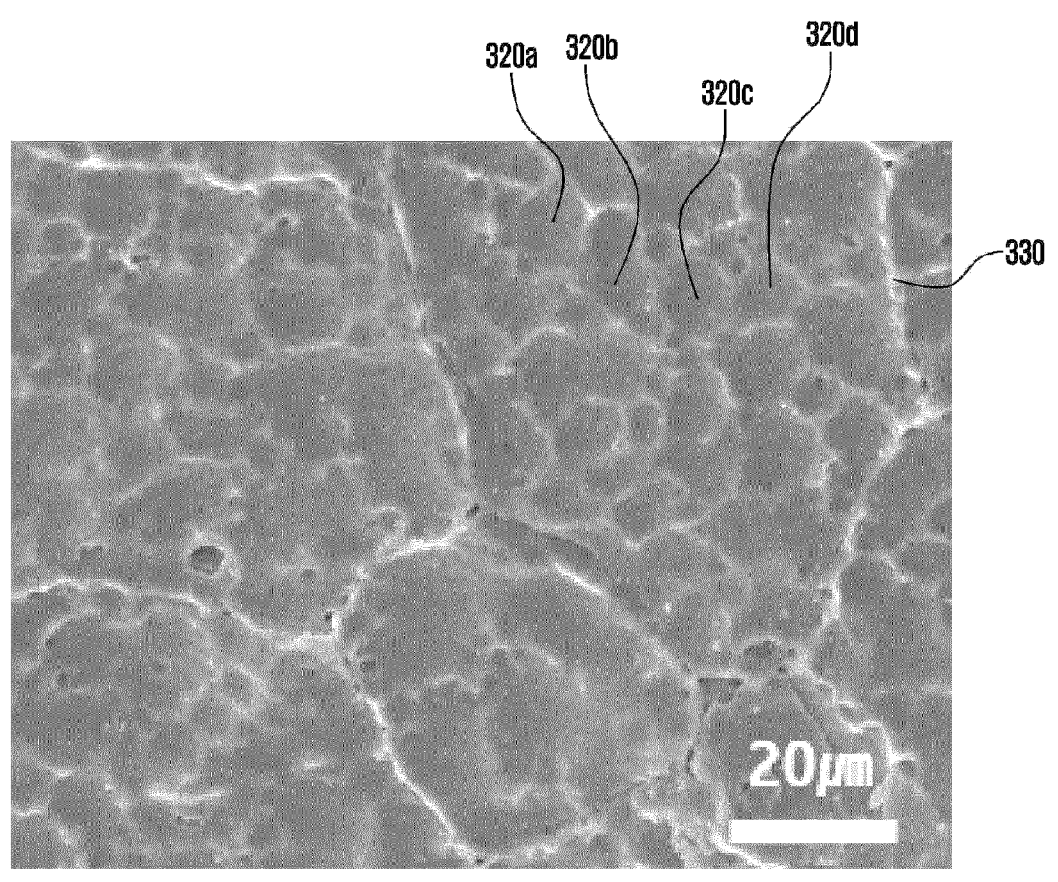
FIG. 6C is a photo obtained by photographing a surface of the housing on which a polishing and washing steps according to an embodiment of the disclosure has been completed by using an electron microscope.

FIG. 6C is a photo obtained by photographing a surface of the housing 210 on which the polishing and washing steps according to an embodiment of the disclosure has been completed by using an electron microscope.

Figure 6D:
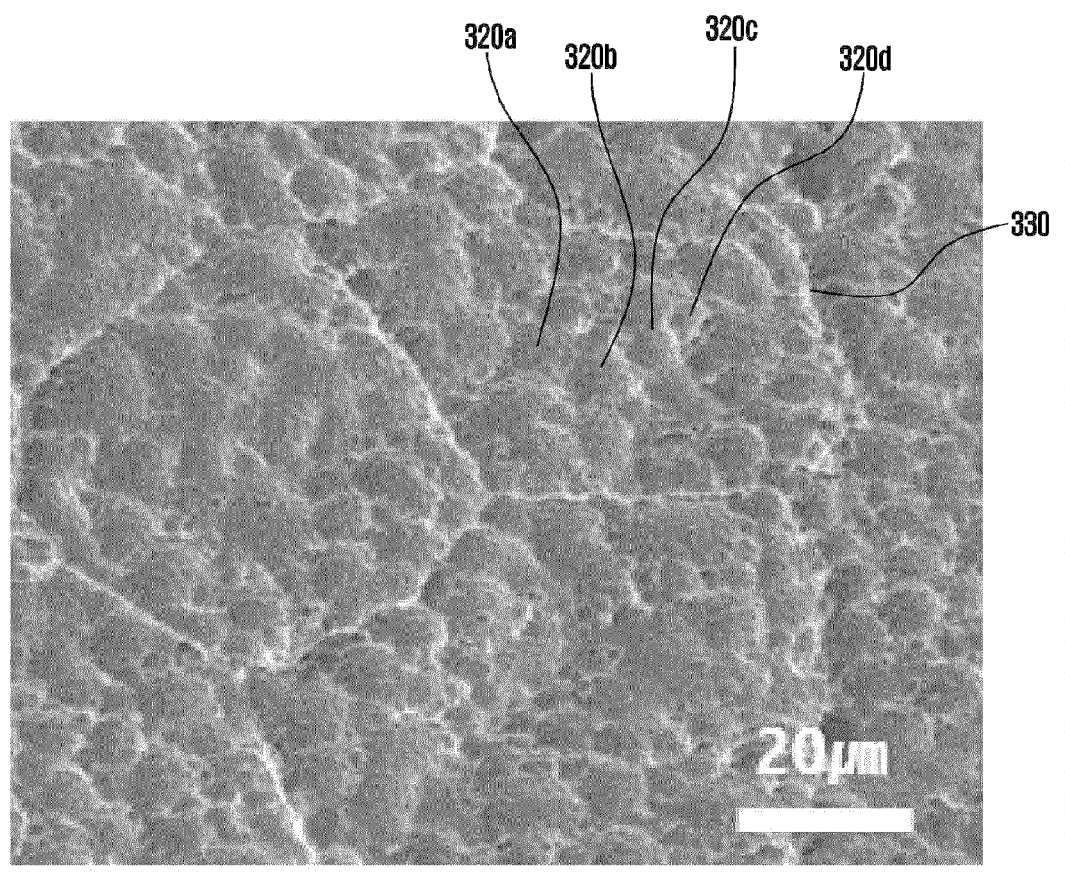
FIG. 6D is a photo obtained by photographing a surface of the housing on which an anodizing step according to an embodiment of the disclosure has been completed by using an electron microscope.

FIG. 6D is a photo obtained by photographing a surface of the housing 210 on which the anodizing step S405 according to an embodiment of the disclosure has been completed by using an electron microscope.

Figure 6E:
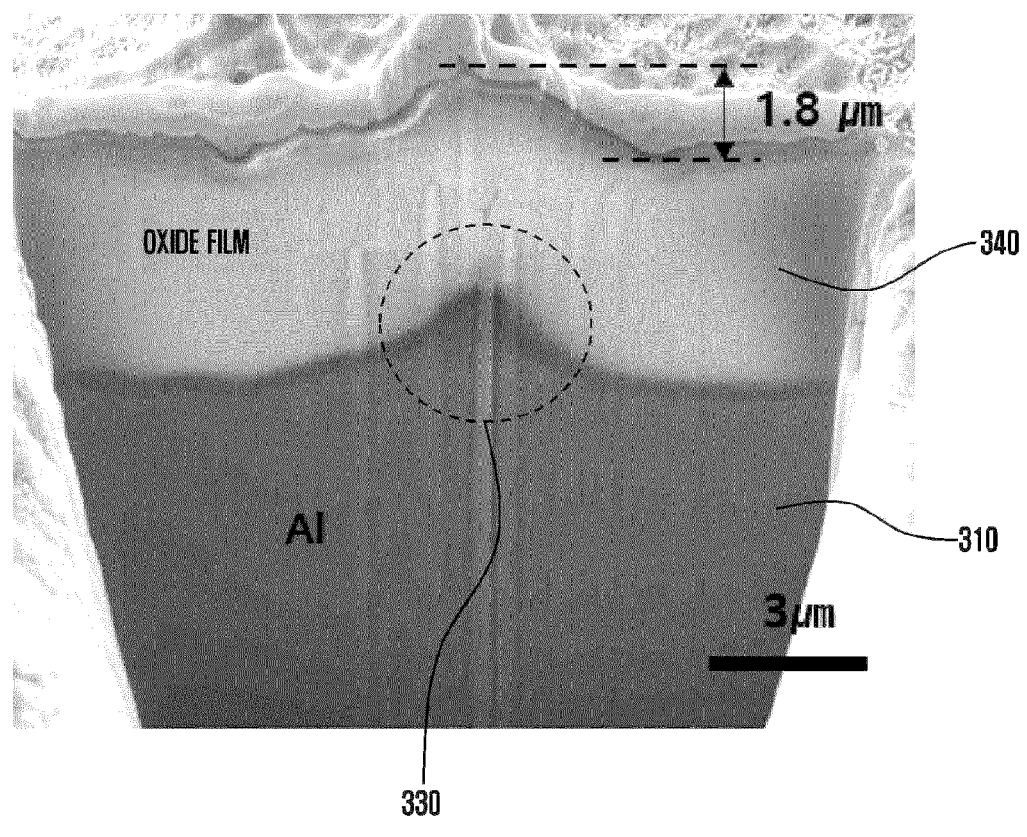
FIG. 6E is a photo obtained by photographing a cross section of a crystal grain boundary protrusion part of a surface of the housing on which the anodizing step according to an embodiment of the disclosure has been completed by using an electron microscope.

FIG. 6E is a photo obtained by photographing a cross section of a crystal grain boundary protrusion part 330 of a surface of the housing 210 on which the anodizing step S405 according to an embodiment of the disclosure has been completed by using an electron microscope.

With reference to FIG. 6A, it may be seen that a surface of the housing 210 includes the pit 320 (320a, 320b, 320c, and 320d) and the crystal grain boundary protrusion part 330 by the pitting corrosion of the chloride ions in the state in which the etching step S403 according to an embodiment of the disclosure has been completed. With reference to FIG. 6B, it may be seen that the fine pits 320 (320a, 320b, 320c, and 320d) each having a size of about 1 micrometer are densely crowded on the surface of the housing 210.

With reference to FIG. 6C, it may be seen that in the state in which the polishing and washing step has been completed, the surface of the housing 210 has softer texture than texture prior to the polishing and washing step. The reason for this may be that sharp cutting edges of the pit 320 (320a, 320b, 320c, and 320d) and the crystal grain boundary protrusion part 330 are abraded and rounded by a chemical polishing solution. Furthermore, it may be seen that the irregularities on the surface by the etching remain intact despite the polishing and washing step except the cutting edges.

With reference to FIG. 6D, it may be seen that a surface of the anodizing layer 340 of the housing 210 on which the anodizing step S405 has been completed has a prominence and depression shape corresponding to a prominence and depression shape of the pit 320 (320a, 320b, 320c, and 320d) and the crystal grain boundary protrusion part 330 formed on the surface of the base material 310. With reference to FIG. 6E, it may be seen that this is because the anodizing layer 340 having a generally given thickness regardless of the irregularity shape of the surface of the base material 310 is formed in the anodizing step S405.

Figure 7A:
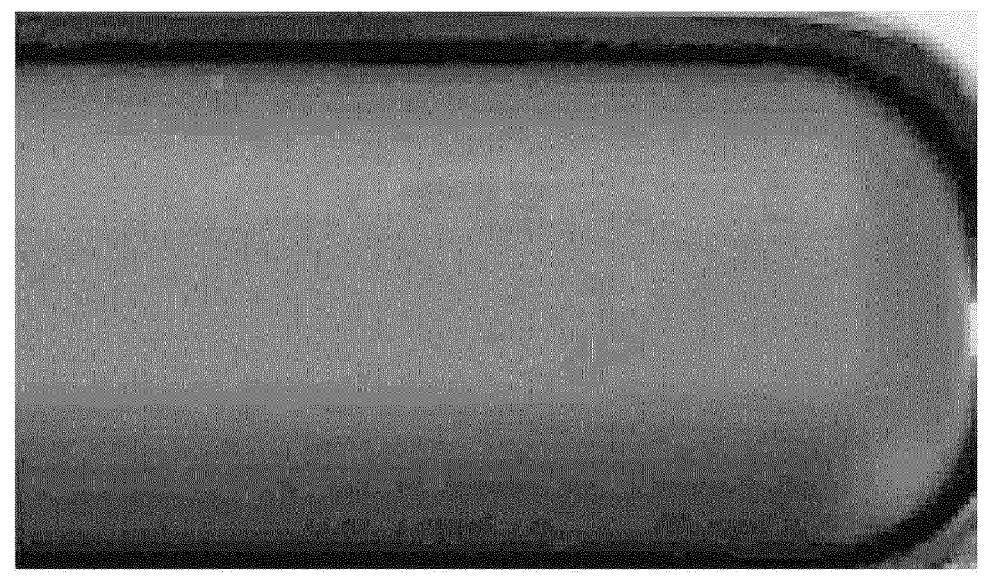
FIG. 7A is a photo obtained by photographing a surface of the housing of an electronic device according to an embodiment of the disclosure.

FIG. 7A is a photo obtained by photographing a surface of the housing 210 of an electronic device according to an embodiment of the disclosure.

Figure 7B:
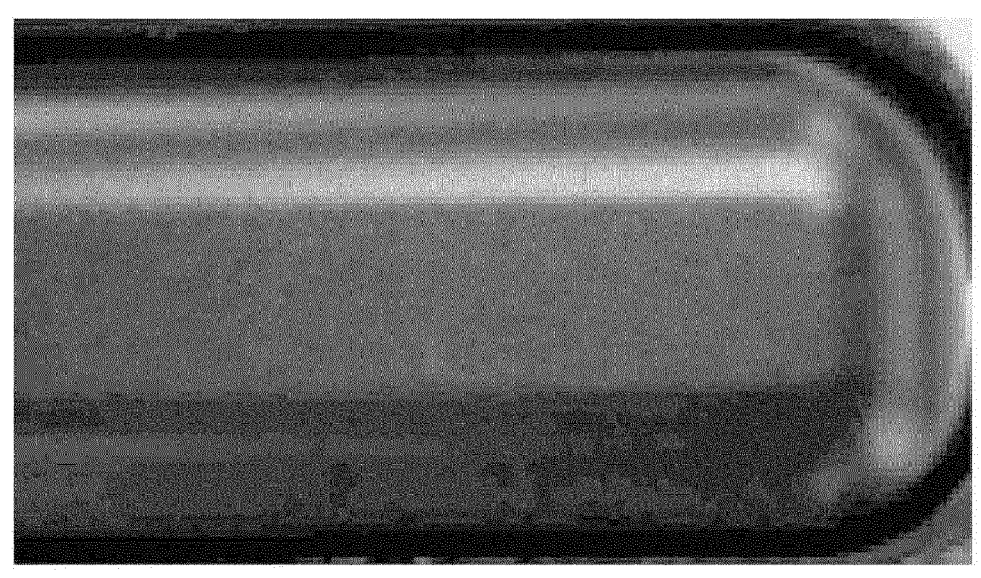
FIG. 7B is a photo obtained by photographing a surface of the housing according to a comparison example.

FIG. 7B is a photo obtained by photographing a surface of the housing 210 according to a comparison example.

The housing 210 of the comparison example was fabricated by forming prominences and depressions on a surface of an aluminum alloy base material 310 by blasting so that the surface of the aluminum alloy base material 310 has roughness similar to that of the housing 210 of the disclosure, then desmutting the surface of the aluminum alloy base material 310, and then forming the anodizing layer 340.

With reference to FIGS. 6A and 6B, it may be seen that the surface of the housing 210 of an electronic device according to an embodiment of the disclosure has fine irregularities having Ra 0.1 to 3 μm and shows texture that is soft while having a matte luster characteristic. In contrast, it may be seen that the housing 210 of the comparison example has a considerable degree of gloss because the prominences and depressions generated by the blasting are smoothed in the desmutting process and has surface texture that is not matte and closer to an orange peel.

Furthermore, embodiments disclosed in this specification and drawings according to this document have merely presented specific examples in order to easily describe technical contents according to the embodiments disclosed in this document and to help understanding of the embodiments disclosed in this document, but are not intended to limit the scope of the embodiments disclosed in this document. Accordingly, all changes or modified forms derived based on the technical spirit of various embodiments disclosed in this document should be construed as being included in the scope of various embodiments disclosed in this document in addition to the embodiments disclosed herein.

What is claimed is:

1. An electronic device comprising a housing, wherein the housing comprises:

a base metal comprising an aluminum alloy; and a plurality of pits and a crystal grain boundary protrusion part formed on a surface of the base metal through etching, wherein the crystal grain boundary protrusion part is etched at grain boundaries of the aluminum alloy to a depth less than a depth of the plurality of pits, and the plurality of pits are formed in areas inside the grain boundaries; and an anodizing layer disposed on the surface of the base metal comprising the plurality of pits and the crystal grain boundary protrusion part, wherein the grain boundaries of the aluminum alloy have a relatively lower concentration of alloying elements than the areas inside the grain boundaries corresponding to the plurality of pits such that the crystal grain boundary protrusion part is formed by the grain boundaries of the aluminum alloy being less etched than the areas inside the grain boundaries when etching with an etchant comprising chloride ions.

2. The electronic device of claim 1, wherein a surface of the anodizing layer has a irregularity shape corresponding to the plurality of pits and the crystal grain boundary protrusion part.

3. The electronic device of claim 1, wherein a respective pit among the plurality of pits has a diameter of 0.1 to 3 micrometers.

4. The electronic device of claim 1, wherein a height of the crystal grain boundary protrusion part protrudes 3 micrometers or less from an average height of the surface of the base metal along the grain boundaries of aluminum alloy.

5. The electronic device of claim 1, wherein the housing has roughness of Ra 3 micrometers or less and gloss of 10 GU or less.

6. The electronic device of claim 2, wherein the anodizing layer comprises pores aligned in a direction perpendicular to a geometric surface of the housing.

7. The electronic device of claim 1, wherein the aluminum alloy comprises aluminum of 80 wt % or more such that the crystal grain boundary protrusion part is formed by the grain boundaries of the aluminum alloy being less etched than the areas inside the grain boundaries corresponding to the plurality of pits when etching with the etchant comprising the chloride ions of 10 wt % or less.

* * * * *